United States Patent [19]

Abe

[11] Patent Number: 5,563,522

[45] Date of Patent: Oct. 8, 1996

[54] MICROWAVE BAND PROBING APPARATUS

[75] Inventor: Masayuki Abe, Itami, Japan

[73] Assignee: Mitsubishi Denki Kabushiki Kaisha, Tokyo, Japan

[21] Appl. No.: 180,338

[22] Filed: Jan. 12, 1994

[30] Foreign Application Priority Data

May 25, 1993 [JP] Japan .................................. 5-121808

[51] Int. Cl.⁶ .............................. G01R 1/06; G01R 31/02
[52] U.S. Cl. .......................... 324/758; 324/72.5; 333/246
[58] Field of Search ..................................... 324/757, 755

[56] References Cited

U.S. PATENT DOCUMENTS

| | | | |
|---|---|---|---|
| 4,731,577 | 3/1988 | Logan | 324/754 |
| 4,827,211 | 5/1989 | Strid et al. | 324/754 |

FOREIGN PATENT DOCUMENTS

| | | |
|---|---|---|
| 59-11444 | 1/1964 | Japan . |
| 60-177641 | 9/1985 | Japan . |
| 63-217634 | 9/1988 | Japan . |
| 1128381 | 5/1989 | Japan . |
| 1179286 | 12/1989 | Japan . |

*Primary Examiner*—Kenneth A. Wieder
*Assistant Examiner*—Barry C. Bowser
*Attorney, Agent, or Firm*—Leydig, Voit & Mayer

[57] ABSTRACT

A microwave band probing apparatus includes a wafer stage for mounting a wafer on which a plurality of microwave integrated circuits are present, an RF probe head for transmitting a microwave signal to a prescribed one of the microwave integrated circuits, and a shielding member covering the prescribed microwave integrated circuit when the RF probe head is in contact with an electrode pad of the microwave integrated circuit. Because the shielding member is electrically connected to the probe stage during probing and thereby a ground plane is produced above the microwave integrated circuit as in a packaged state, the conditions upon the measurement of microwave characteristics in the on-wafer state and in the packaged state are approximately the same.

5 Claims, 10 Drawing Sheets

MICROWAVE BAND PROBING APPARATUS

FIELD OF THE INVENTION

The present invention relates to a microwave band probing apparatus for measuring the characteristics of an integrated circuit operating at a microwave band in on-wafer state and, more particularly, to a construction that enables performing measurements in a packaged state.

BACKGROUND OF THE INVENTION

Figure 9:
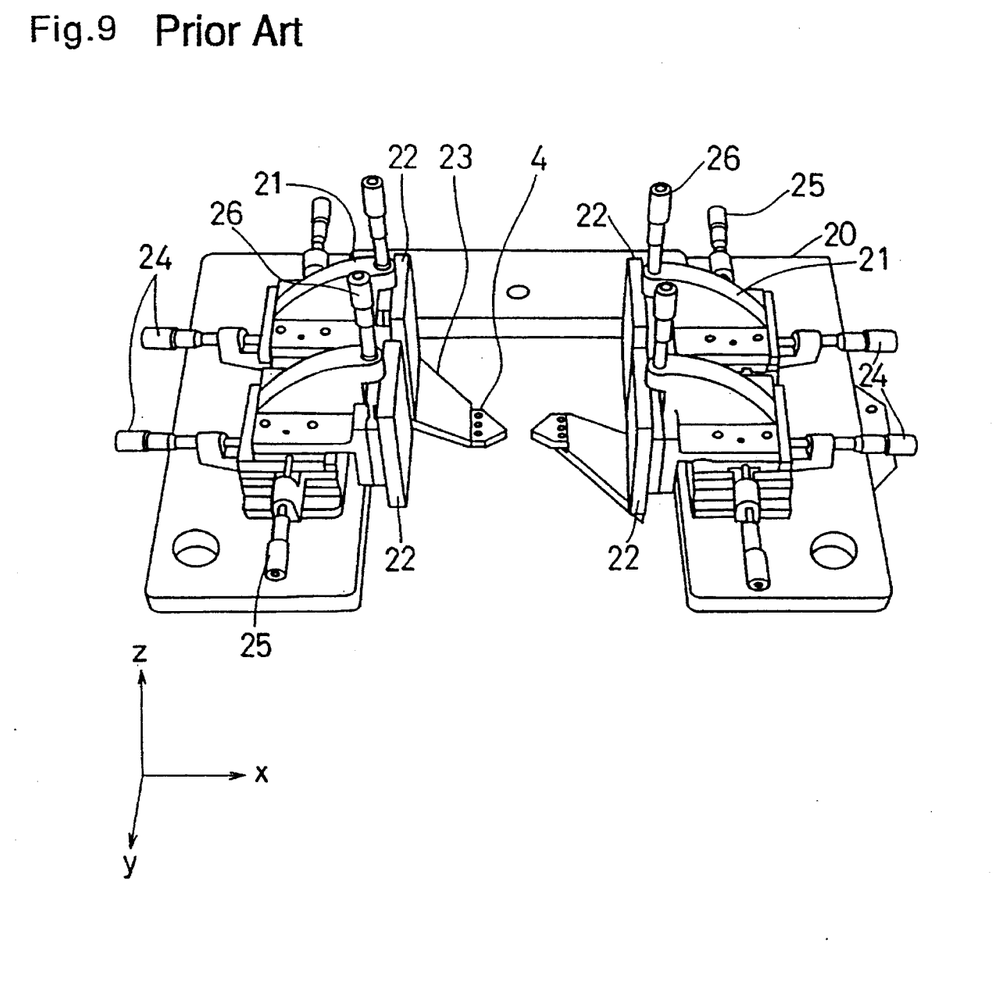
FIG. 9 is a perspective view illustrating a probe head of a prior art microwave band on-wafer probing apparatus.

FIG. 9 shows a construction of the vicinity of a probe head of a prior art microwave band probing apparatus for testing a semiconductor device operating at a microwave band in on-wafer state. In FIG. 9, reference numeral 20 designates an approximately U-shaped top plate. Positioning adjustment mechanisms 21 respectively called positioners are disposed on the top plate 20. Members 22 respectively called risers are fixed to the positioners 21, and arm members 23 respectively called zero degree arms are provided at the top ends of the risers 22. X-axis micrometer heads 24 are provided for adjusting the positions in the x-axis direction of the positioners 21. Y-axis micrometer heads 25 are provided for adjusting the positions in y-axis direction of the positioners 21. Z-axis micrometer heads 26 are provided for adjusting the positions in the z-axis direction of the positioners 21. Reference numeral 4 designates probe heads fixed to the top ends of the arm members 23.

Figure 10A:
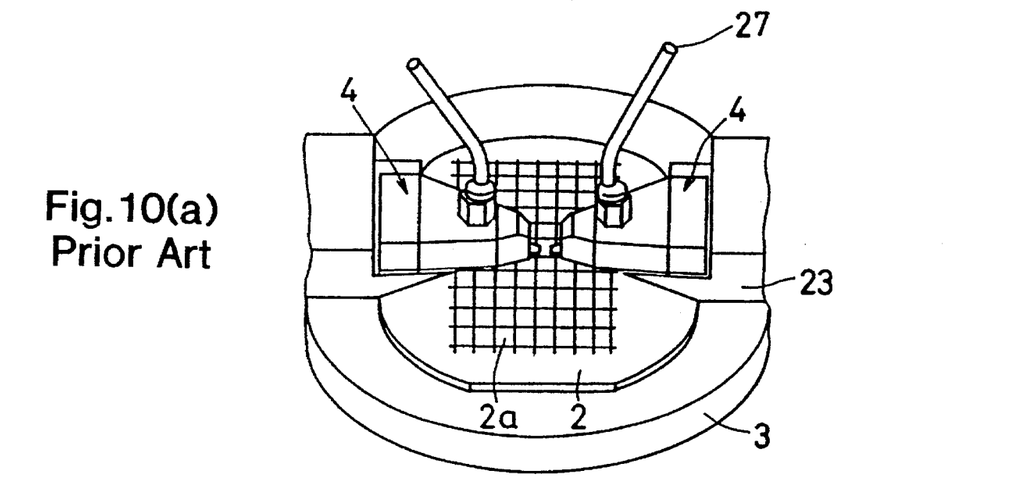
FIGS. 10(a)–10(d) are diagrams for explaining an on-wafer test employing the prior art microwave band on-wafer probing apparatus.
Figure 10B:
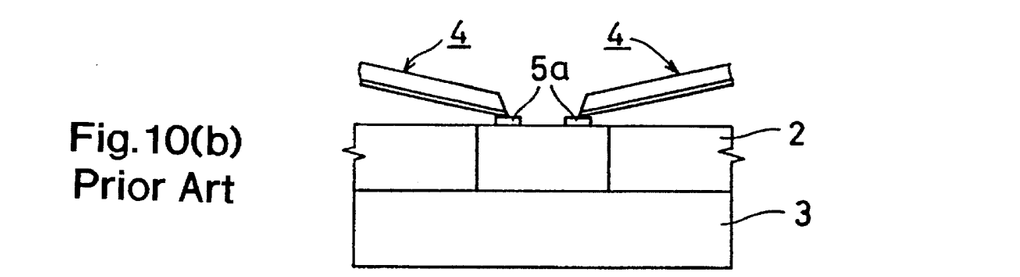

FIGS. 10(a), and 10(b) are a perspective view and a partial cross-sectional view, respectively, showing the vicinity of the probe head 4 of the microwave band probing apparatus in a state where the apparatus is used. In the figures, reference numeral 3 designates a probe stage comprising a conductor such as metal serving as a plate for mounting a wafer 2. The wafer 2 comprises a compound semiconductor such as gallium arsenide on which a circuit 2a comprising an active element and a passive element (hereinafter referred to as "microwave monolithic integrated circuit", i.e., "MMIC") is provided. Reference numeral 4 designate RF probe heads having coplanar lines produced by evaporation or the like of metal, for example, Au on a dielectric material layer comprising such as sapphire. RF input and output electrode pads 5a of the MMIC 2a are produced by evaporation or the like of metal, for example, Au on the wafer 2. Reference numeral 27 designates coaxial cables for applying a signal to the coplanar lines of the RF probe heads 4.

Figure 10C:
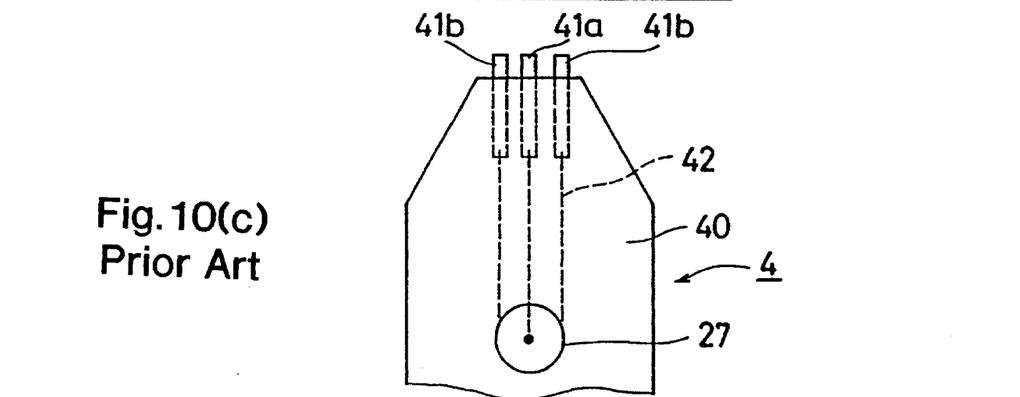

FIG. 10(c) is a plan view illustrating a detail construction of the RF probe head 4, and probes 41a and 41b comprising coplanar lines are provided on one side surface of the dielectric layer 40 comprising sapphire. These probes 41a and 41b are electrically connected to the coaxial cable 27 by wirings 42, whereby a prescribed test signal (microwave signal) is supplied to the probe 41a and the ground voltage is supplied to the probes 41b. The probes 41b are in contact with a grounding electrode pad 5b at the surface of the MMIC 2a (FIG. 10(d)).

Figure 11:
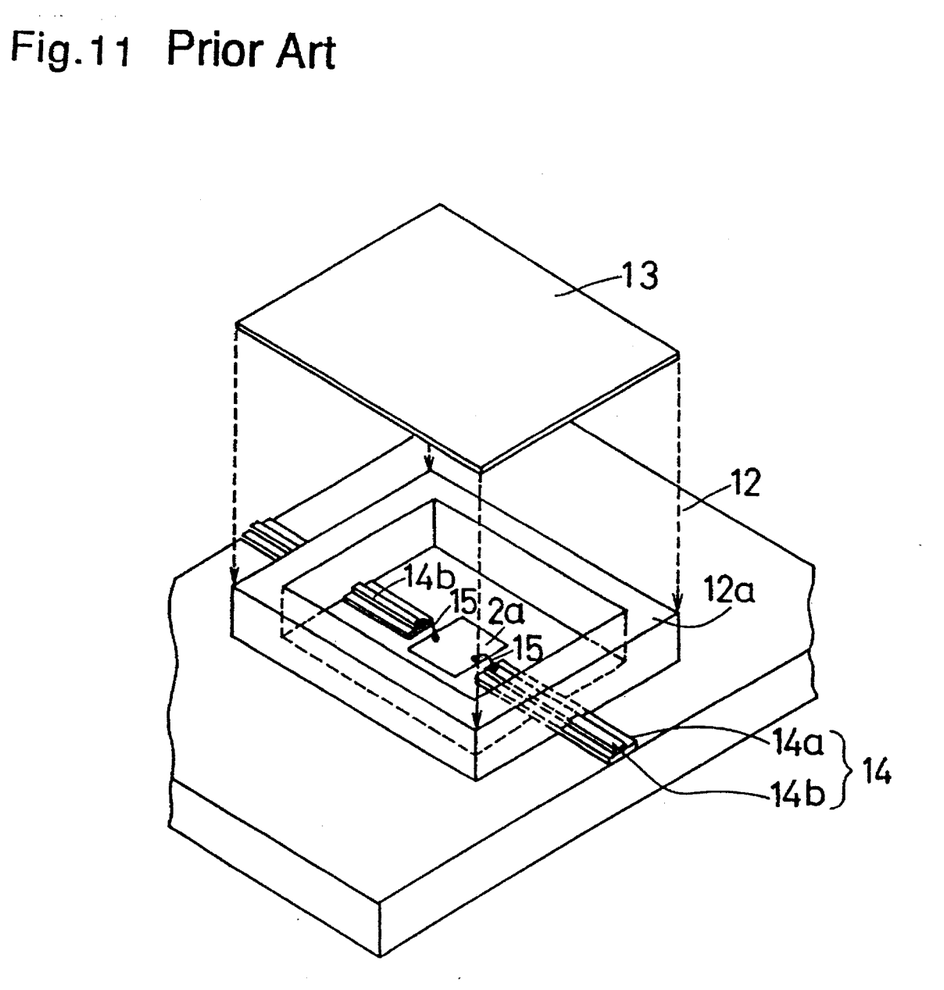
FIG. 11 is a perspective view illustrating a state where a conventional MMIC is mounted on a conventional package.

FIG. 11 shows a perspective view illustrating a state where the MMIC 2a is mounted in a package. In the figure, reference numeral 13 designates a lid for the package comprising a metal. A package body 12 comprises a conductive layer. A cavity wall 12a is provided for containing the MMIC 2a. A microstrip line 14 is produced by evaporating a metal such as Au, 14b on a dielectric material layer 14a comprising sapphire on the package body 12. Reference numeral 15 designate wires each comprising a conductive

2 material for connecting the metal 14b of the microstrip line 14 and the electrode pad of the MMIC 2a.

Figure 12A:
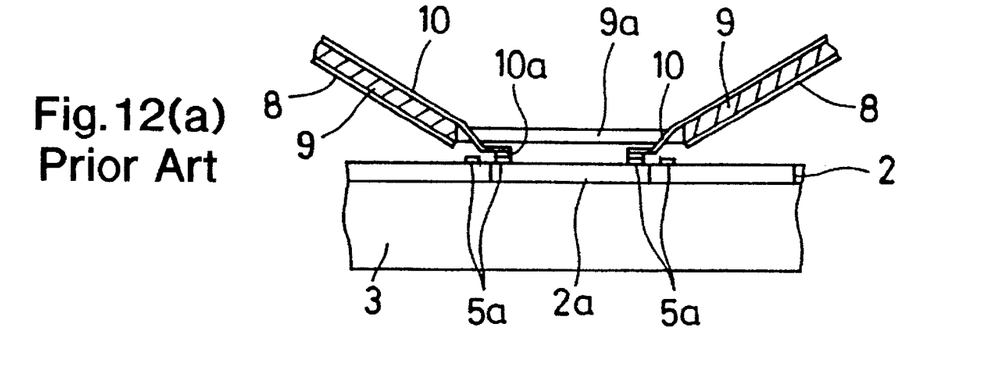
FIGS. 12(a) and 12(b) show a cross-sectional view and a plan view of the vicinity of a probe head of a prior art on-wafer probing apparatus employing a TAB tape.
Figure 12B:
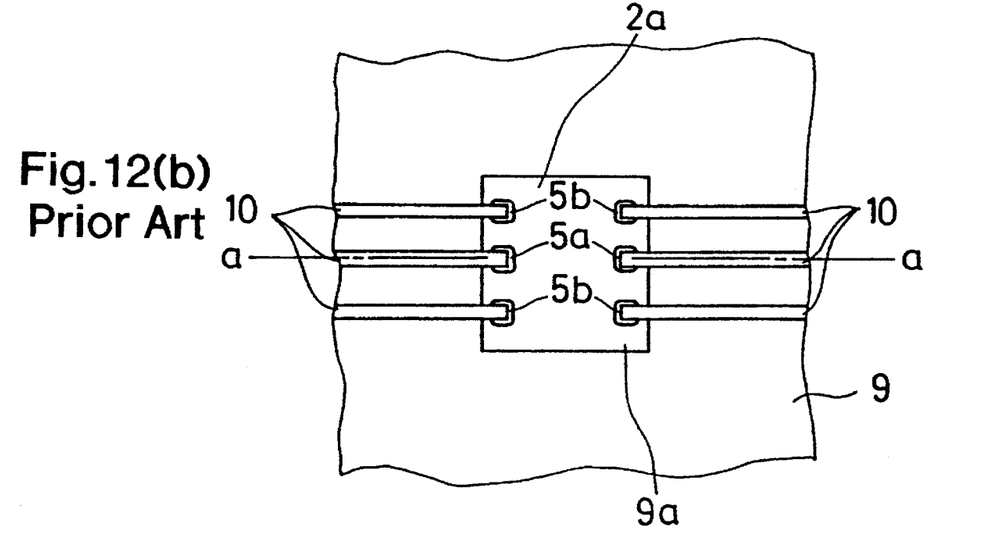

FIGS. 12(a) 12(b) are a partial cross-sectional view and a plan view, respectively, showing the vicinity of an RF probe head of a microwave probing apparatus employing a TAB tape for the probe needle. In the figures, reference numeral 9 designates a dielectric material layer comprising a polyimide TAB tape. A metal layer 8 serving as a ground layer is produced at the entire surface of one side of the dielectric material layer 9. Signal lines 10 comprising metal such as Au are produced on the other side surface of the dielectric material layer 9 by evaporation, and contact electrodes 10a are produced at the top ends thereof. A microstrip line is constituted by the dielectric material layer 9, the metal layer 8 and the signal lines 10. Reference numeral 9a designates an aperture produced at the dielectric material layer 9.

A description is given of the probing methods employing these probing apparatus.

Figure 10D:
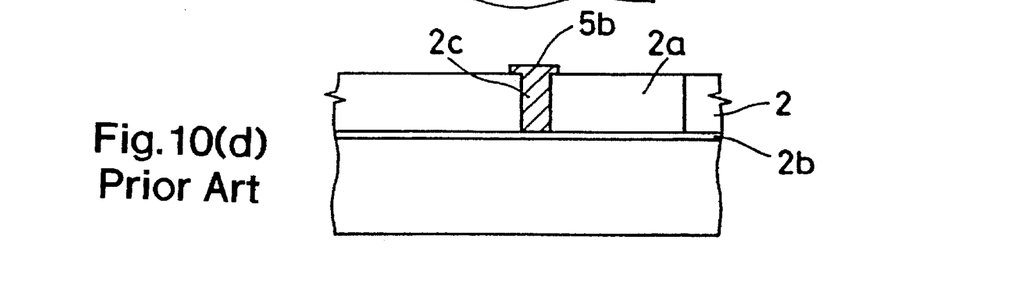

First of all, when the probing apparatus of the structure of FIG. 10(a) is employed, the wafer 2 mounted on the probe stage 3 is fixed by a vacuum mechanism (not shown) of the probe stage 3, and the RF probe heads 4 are brought into contact with the RF I/O electrode pads 5a of the MMIC 2a produced on the wafer 2. A microwave signal that is input from one probe head 4 in this state is amplified, reflected, and attenuated at the MMIC 2a, and is output from the other RF probe head 4. By measuring the input signal, output signal and reflected signal, microwave characteristics such as power, noise, or the like, of the MMIC 2a are obtained. A rear surface metal 2b is produced on the entire rear surface of the wafer 2 as shown in FIG. 10(d), and this rear surface metal 2b and the ground electrode pad 5b are connected via a via-hole 2c, whereby when the transmission line of the MMIC 2a is a microstrip line, the ground plane thereof is the probe stage 3, i.e., the wafer rear surface.

A description is given of the method for measuring the microwave characteristics of the MMIC which is mounted on a package. In FIG. 11, a microwave signal is transmitted through the input side microstrip line 14a and the wiring 15 and input to the MMIC 2a on the conductive layer 12. The microwave signal which is amplified or attenuated here is transmitted through the output side microstrip line 14a and output therefrom. By measuring the input signal, output signal, and reflected signal or the like, microwave characteristics such as power, noise, or the like, of the MMIC 2a are obtained. The ground plane of the MMIC 2a then is the conductive layer 12, the cavity wall 12a and the lid 13 of the package.

A description is given of the probing method using the TAB tape of FIG. 12(a). By contact the RF I/O electrode pads 5a to the wafer 2 and the contact electrodes 10a produced at the top ends of the signal lines 10 of the TAB tape to each other, a microwave signal is transmitted on the microstrip line comprising the ground layer 8, the dielectric material layer 9 and the signal lines 10, and after amplification or attenuation by the MMIC 2a, it is transmitted through the other TAB tape microstrip line and output. By measuring the input signal, output signal, and reflected signal or the like, microwave characteristics such as power, noise or the like, of the MMIC 2a are obtained. The probe stage 3 is then used as the ground plane of the MMIC 2a.

Japanese Published Patent Application No. 63-217634 discloses a structure in which part of the probe head including a probing needle adjusting mechanism is covered by an electromagnetic shielding member. The structure in this publication aims at preventing the electronic circuit from being affected by external noise. In this construction, however, an electromagnetic field distribution equivalent to that in a packaged state cannot be realized in the on-wafer state, still leaving the above described problem unsolved.

The prior art microwave band probing apparatus is constructed as described above, and even when the microwave characteristics of the same MMIC are measured, the ground planes of the elements during the measurement in an on-wafer state and at the measurement in a packaged state are different. This makes in the states of the electromagnetic fields different from each other, resulting in differences in the impedances at the measurements, thereby resulting in differences in the microwave characteristics obtained from the measurements.

SUMMARY OF THE INVENTION

It is an object of the present invention to provide a microwave band probing apparatus that can perform measurements of the microwave characteristics in an on-wafer state and in a packaged state and obtain results approximately coincident with each other.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, the upward position of an MMIC is covered by a box-type shielding metal comprising a conductive layer electrically connected to a probe stage serving as a ground plane of the MMIC during probing. Because the shielding metal or the ground plane of the TAB tape is electrically connected to the probe stage during probing and thus the ground plane is at an upward position of the MMIC similar to a packaged state, the conditions during the measurements of microwave characteristics in an on-wafer state and in a packaged state are approximately in coincident with each other.

According to a second aspect of the present invention, the upper surface of the shielding metal has a mesh configuration. Therefore, the positional alignment of the probe head with the MMIC at the probing is simplified.

According to a third aspect of the present invention, the shielding metal is held rotatably above the MMIC. Therefore, the positional alignment of the probe head with the MMIC is simplified and the workability of the probing is improved.

According to a fourth aspect of the present invention, a DC voltage supplying means for supplying a DC bias to the MMIC is provided at the shielding metal. Therefore, the electrical characteristics in a state close to the actual use state can be measured.

According to a fifth aspect of the present invention, in a probing apparatus utilizing a TAB tape, a ground layer of the TAB tape electrically connected to the probe stage is provided above the MMIC. Therefore, the electrical characteristics in a state close to the actual use state can be measured.

According to a sixth aspect of the present invention, an aperture is provided at a part of the TAB tape for performing positional alignment with the MMIC. Therefore, the positional alignment of the probe with the MMIC can be performed visually.

According to a seventh aspect of the present invention, grounding contact electrodes in contact with ground electrode pads of the MMIC of the TAB tape and connected to the ground layer via via-holes are provided. Therefore, the ground voltage can be supplied to the ground layer from the vicinity of the MMIC as a target of measurement, and also a ground plane can be produced by the via-holes at upper side surfaces surrounding the MMIC.

According to an eighth aspect of the present invention, a TAB tape having via-holes at positions corresponding to the electrode pads and the grounding electrode pads at the surface of the microwave integrated circuit and having a ground layer at one side surface thereof is used as a spacer material thereby to perform probing. Therefore, a plurality of MMICs can be tested successively with a one time position determination.

DETAILED DESCRIPTION OF THE PREFERRED EMBODIMENTS

EMBODIMENT 1.

Figure 1:
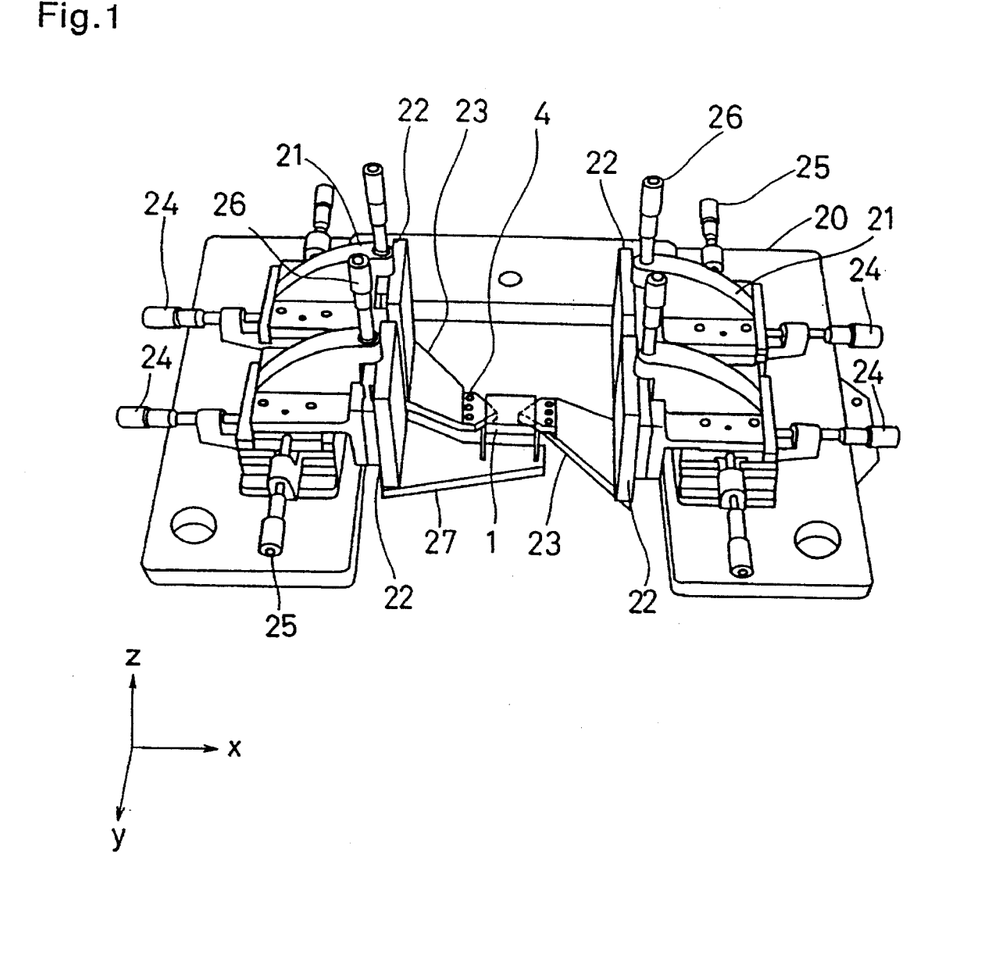
FIG. 1 is a perspective view illustrating an RF probe head of a microwave band probing apparatus according to a first embodiment of the present invention.

FIG. 1 is a schematic diagram illustrating a construction of the vicinity of a probe head of a microwave band probing apparatus according to a first embodiment of the present invention. In the figure, reference numerals the same as those in FIG. 9 designate the same or corresponding portions. Reference numeral 1 designates a shielding metal fixed to a riser which is mounted on a supporting plate 27.

Figure 2A:
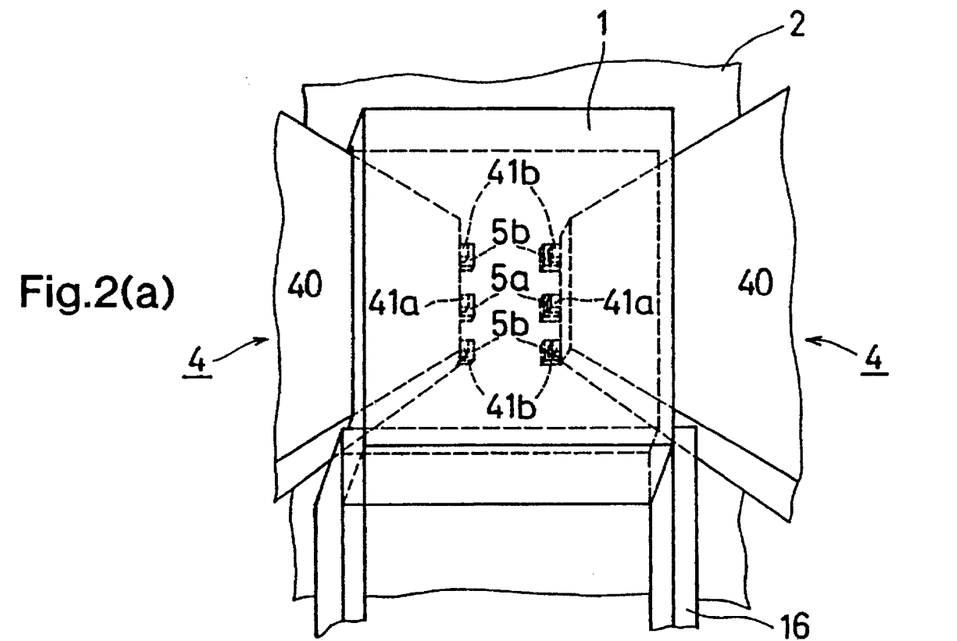
FIGS. 2(a) and 2(b) show an enlarged view and a cross-sectional view of the vicinity of the RF probe head of the microwave band probing apparatus.
Figure 2B:
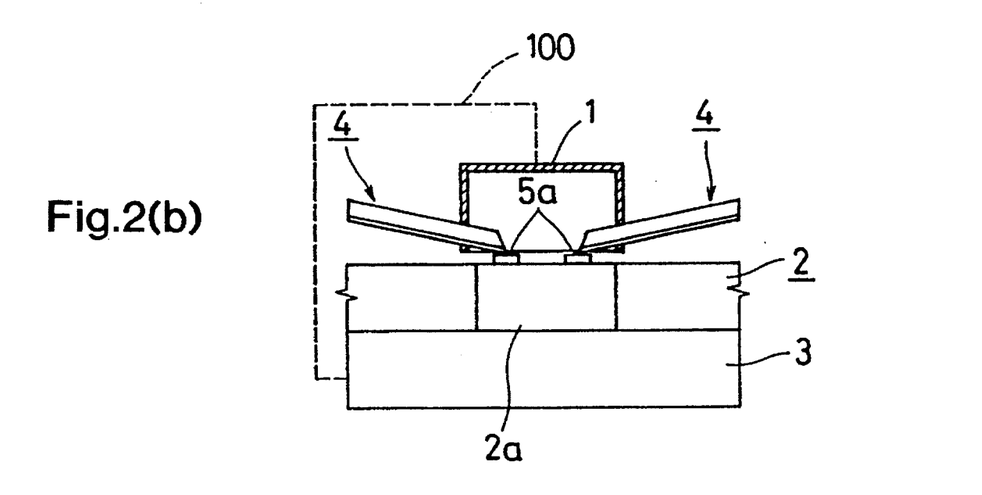

FIGS. 2(a) 2(b) are a perspective view and a cross-sectional view, respectively, showing in detail the vicinity of the above described probe head. In the figures, reference numeral 1 designates a box-type shielding metal comprising an electrically conducting material such as metal. This shielding metal 1 is fixed to the supporting plate 27 via a supporting bar 16, electrically insulated from the RF probe head 4, and electrically connected to the probe stage 3 by a wiring 100.

A description is given of the probing method.

First of all, a wafer 2 having an MMIC produced thereon is fixed on the probe stage 3. Next, by moving the RF probe head 4, probe needles 41a and 41b of the RF probe head 4 are put in contact with the electrode pads 5a and 5b produced on the wafer 2. Subsequently, the position of the positioner 21 to which the shielding metal 1 is fixed is adjusted by the x-axis, y-axis, and z-axis micrometer head 24, 25 and 26, and the top ends of the dielectric material layers 40 are covered by the shielding metal 1 as shown in FIG. 2(a). Then, a microwave signal source is connected to the probe needles 41a of the RF probe heads 4, and the signal from the microwave signal source is transmitted through the probe needle 41a of the input side RF probe head 4 to the MMIC 2a. The signal amplified or attenuated at the MMIC 2a is transmitted through the probe needle 41a of the output side RF probe head 4 and is measured at the output side.

The box-type shielding metal 1 comprising a conductor is arranged above the MMIC 2a, and constitutes a ground plane together with the probe stage 3. Accordingly, the electromagnetic field distribution at the periphery of the MMIC 2a while measuring the microwave characteristics is in a state similar to that of a packaged state, and the conditions during the measurements of the characteristics in an on-wafer state and in a package mounted state approximately coincide with each other.

As described above, in this first embodiment, the upward portion and the side surface of the MMIC 2a to be measured are covered by the shielding metal 1 fixed to the supporting plate 27 during the probing, and therefore the ground plane during the on-wafer probing includes the probe stage 3 and the shielding metal 1, and the electromagnetic field distribution at the periphery of the MMIC 2a is approximately the same as that in a state where the MMIC 2a is mounted in a high frequency package. Therefore, the result obtained by measurement in an on-wafer probing and the result obtained by measurement after packaging of the same MMIC are approximately the same. Accordingly, the characteristics of the MMIC after packaging can be grasped in an on-wafer state, thereby enabling packaging with assured the characteristics in an on-wafer state.

EMBODIMENT 2.

Figure 3:
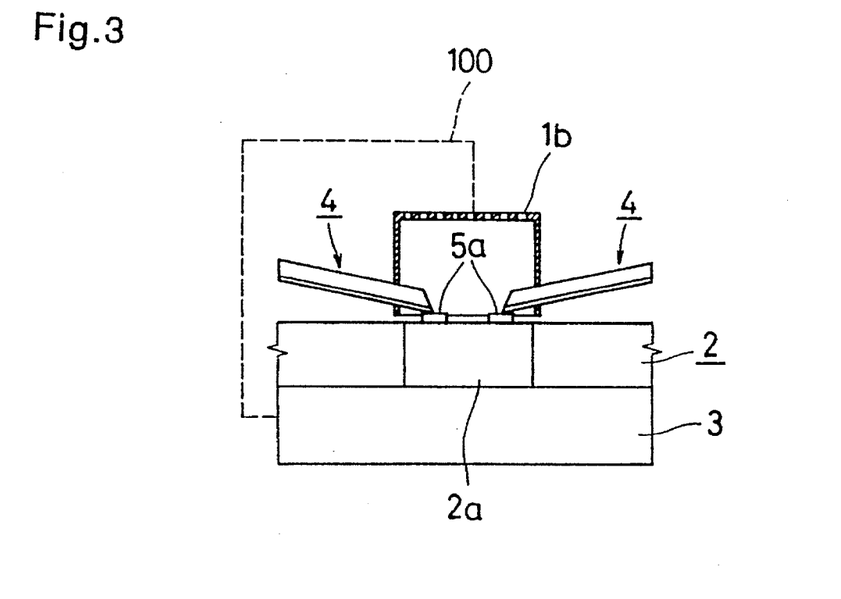
FIG. 3 is a cross-sectional view showing the vicinity of an RF probe head of a microwave band probing apparatus according to a second embodiment of the present invention.

FIG. 3 shows a cross-sectional view of the vicinity of an RF probe head of a microwave band probing apparatus according to a second embodiment of the present invention. In the figure, reference numeral 1b designates a shielding metal whose upper surface is a mesh. The size of the mesh aperture and the interval between the mesh apertures of this shielding metal 1b are required to be smaller than the wavelength of the microwaves used for measuring the characteristics of the MMIC.

By employing the mesh shielding metal 1b as shown in the drawing, when bringing the RF probe heads 4 in contact with the electrode pads 5a and 5b of the wafer 2 fixed on the probe stage 3, the positional alignment of the electrode pads and the RF probe heads is determined visually from above, whereby workability is improved.

EMBODIMENT 3.

Figure 4:
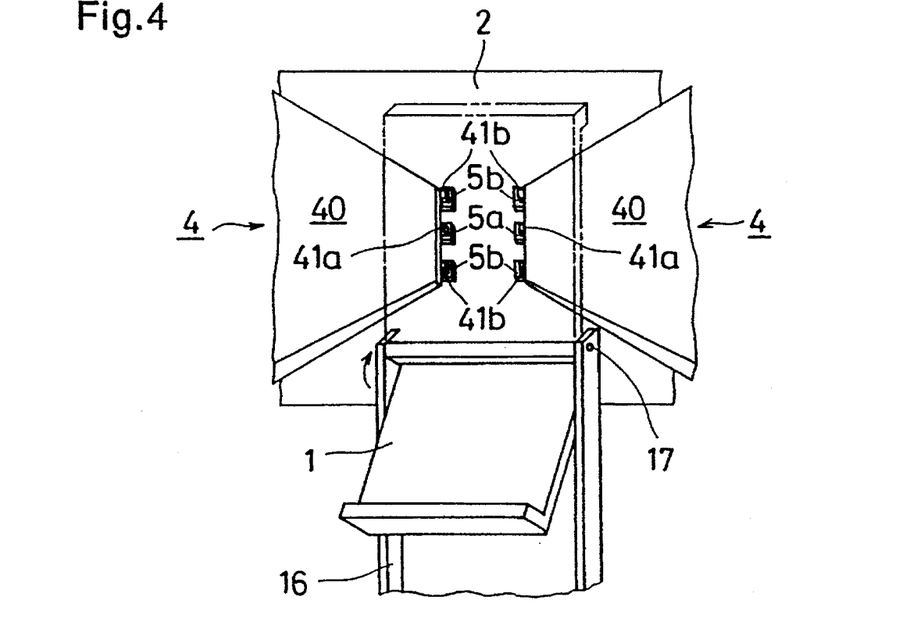
FIG. 4 is an enlarged view showing the vicinity of an RF probe head of a microwave band probing apparatus according to a third embodiment of the present invention.

FIG. 4 shows an enlarged view of the vicinity of an RF probe head of a microwave band probing apparatus according to a third embodiment of the present invention. In the figure, reference numeral 17 designates an axle provided at the end of a supporting bar 16, and the shielding metal 1 is supported rotatably by an axle 17.

In this third embodiment, when putting the RF probe head 4 in contact with the electrode pads 5a and 5b produced on the wafer 2, there is no obstacle. Therefore, the positional alignment can be carried out more precisely and easily than using the mesh shielding metal 1b of the second embodiment. In addition, by removing the shielding metal 1 from above the RF probe head 4 by rotating the shielding metal 1 after finishing the work, the RF probe head 4 can be moved swiftly to the next MMIC 2a, thereby further improving workability.

EMBODIMENT 4.

Figure 5A:
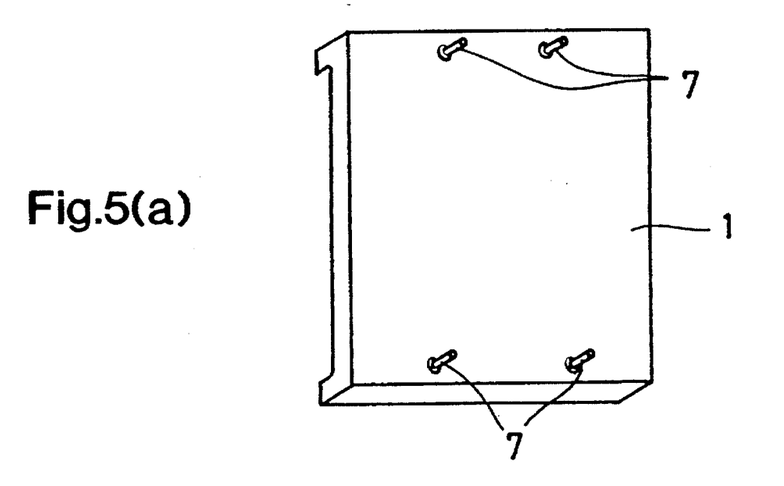
FIGS. 5(a)–5(c) show a perspective view and side views of a shielding metal which is fixed to an RF probe head of a microwave band probing apparatus according to a fourth embodiment of the present invention.
Figure 5B:
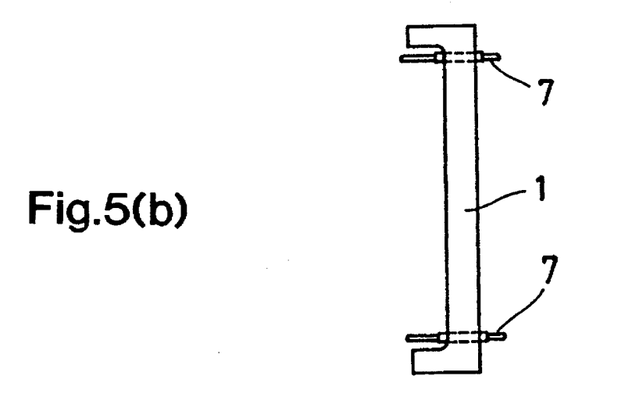
Figure 5C:
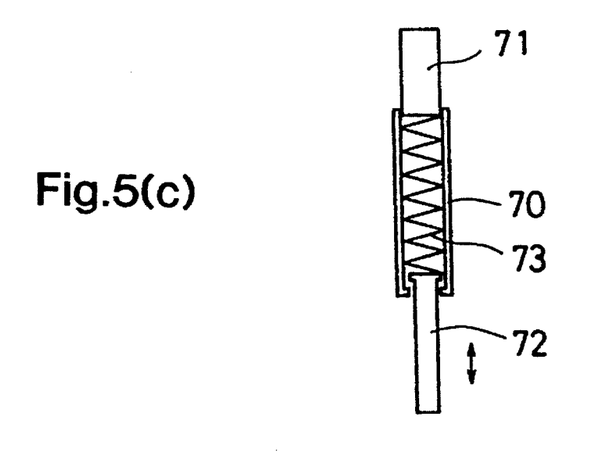

FIGS. 5(a)–5(c) show a shielding metal fixed to an RF probe head of a microwave band probing apparatus according to a fourth embodiment of the present invention. In the figures, reference numeral 7 designates spring-loaded probes (DC supplying parts) provided at the shielding metal 1 corresponding to the positions on the chip where DC bias terminals are located. One side end of cylindrical part 70 of this spring-loaded probe 7 is closed by a terminal 71, and a chip contacting terminal 72 is slidable in the arrow direction inside the cylindrical part 70, and this chip contacting terminal 72 is urged to the outside of the cylindrical part 70 by a spring 73.

In the fourth embodiment of such construction, a DC bias can be supplied to the chip during an on-wafer test, whereby the electrical characteristics can be measured in an operation state similar to an actual use state.

EMBODIMENT 5.

Figures 6A, 6B:
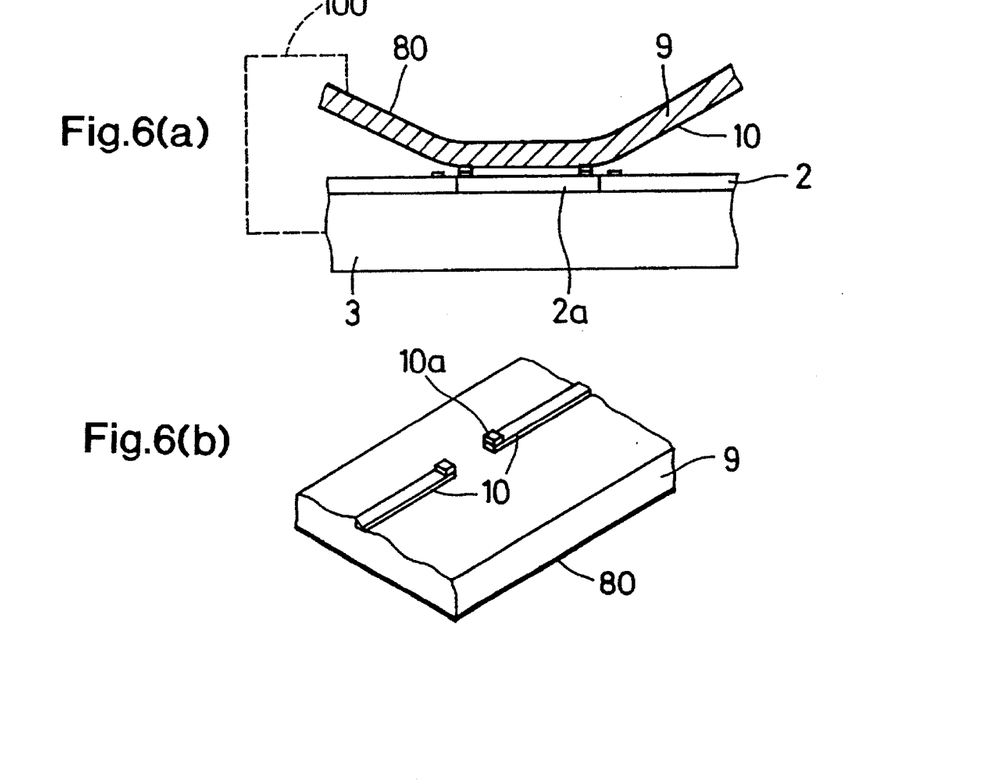
FIGS. 6(a) and 6(b) show a cross-sectional view and a perspective view of the vicinity of an RF probe head utilizing a TAB tape of a microwave band probing apparatus according to a fifth embodiment of the present invention.

FIGS. 6(a) and 6(b) show the vicinity of an RF probe head employing a TAB tape of a microwave band probing apparatus according to a fifth embodiment of the present invention. In FIG. 6(a), reference numeral 10 designates signal lines each produced by evaporating a metal such as Au on a surface opposite the wafer 2 of the dielectric material layer 9, and a ground layer 80 is produced on the entire surface of the dielectric material layer 9 opposite to the surface where the signal lines 10 are produced. This ground layer 80 is electrically connected to the probe stage 3.

In the fifth embodiment of such construction, when contacting the contact electrodes 10a at the top ends of the signal lines 10 with the RF I/O electrode pads 5a of the MMIC 2a produced on the wafer 2, a microstrip line is produced by the ground layer 80, the dielectric material layer 9, and the signal lines 10. Because the probe stage 3 and the ground layer 80 are then employed as the ground plane of the MMIC 2a, the electrical characteristics can be measured in a state close to in a state when the MMIC 2a is packaged.

EMBODIMENT 6.

Figures 7A, 7B:
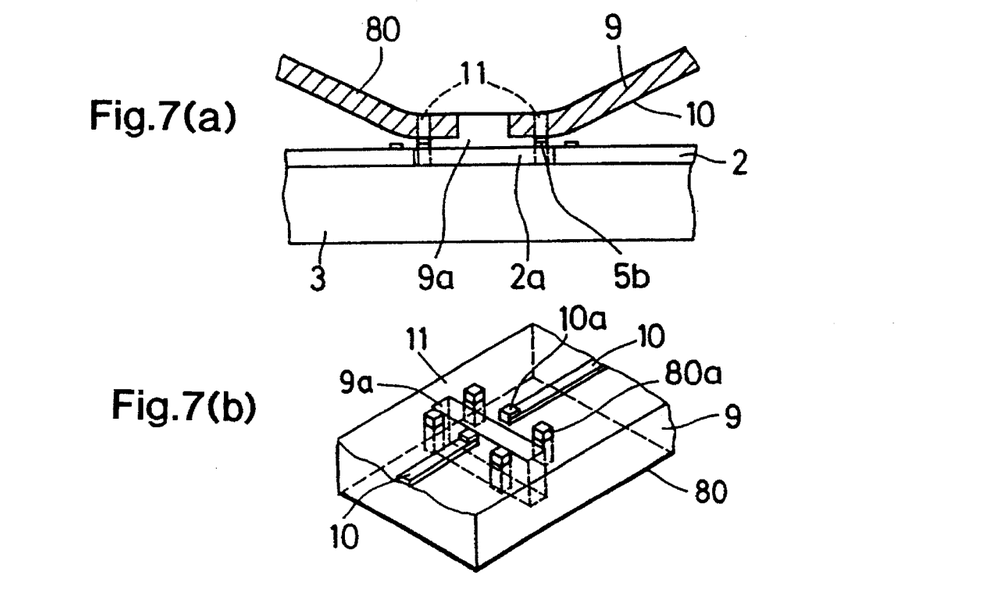
FIGS. 7(a) and 7(b) show a cross-sectional view and a perspective view of the vicinity of an RF probe head utilizing a TAB tape of a microwave band probing apparatus according to a sixth embodiment of the present invention.

FIG. 7(a) and 7(b) show the vicinity of an RF probe head employing a TAB tape of a microwave band probing apparatus according to a sixth embodiment of the present invention. In the figures, reference numeral 11 designate via-holes each coated with a metal such as Au in an aperture having a diameter of about several μm to several hundred μm, and these via-holes electrically connect the ground layer 80 produced at the surface of the dielectric material layer 9 and grounding contact electrodes 80a produced at the rear surface of the dielectric material layer 9. Further, reference numeral 9a designates an aperture in at the dielectric material layer 9 for positional alignment of the probe head with the MMIC 2a during probing. The other construction is the same as that of the fifth embodiment.

In the sixth embodiment, because the grounding contact electrode 80a of the probe head is in contact with the grounding electrode pad 5b of the MMIC 2a to which the ground voltage is supplied, the probe stage 3 and the ground layer 80 are electrically connected via the via-hole 11 at a portion closer to the MMIC 2a, whereby the ground voltage is supplied to the ground layer 80 without wiring. Further, because a ground electrode region is produced by the via-hole 11 at the periphery of the MMIC 2a, the electric characteristics can be measured in a state closer to a state where the MMIC 2a is packaged than in the fifth embodiment.

In this sixth embodiment, a longitudinally elongated aperture 9a is produced at the dielectric material layer 9, but the aperture 9a is preferred to be smaller in order to produce an electromagnetic field distribution at the periphery of the MMIC 2a similar to that in a packaged state, and therefore the aperture 9a is only required to be of a size that enables observation of a prescribed pattern on a chip when positionally aligning the probe head with the MMIC 2a. Thus, the aperture 9a is not necessarily required to have a elongated configuration.

EMBODIMENT 7.

Figure 8A:
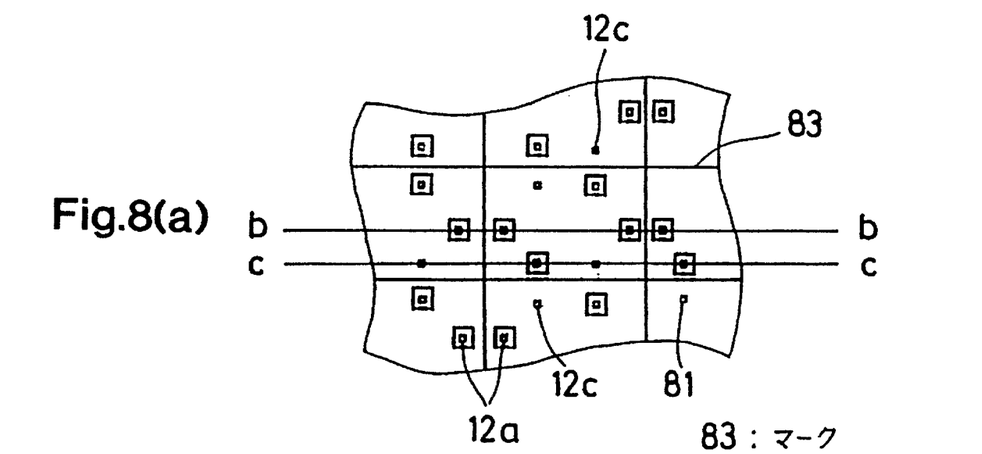
FIGS. 8(a)–8(c) show a cross-sectional view of the vicinity of a spacer and an RF probe head comprising a TAB tape of a microwave band probing apparatus according to a seventh embodiment of the present invention.
Figure 8B:
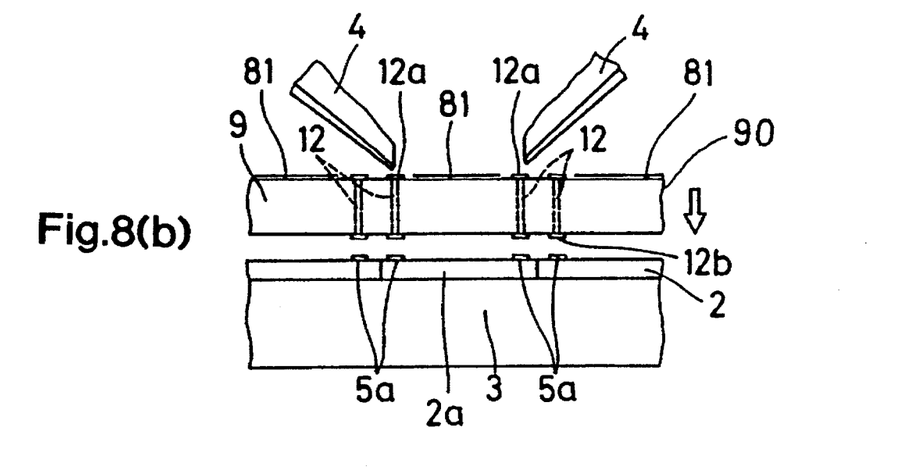
Figure 8C:
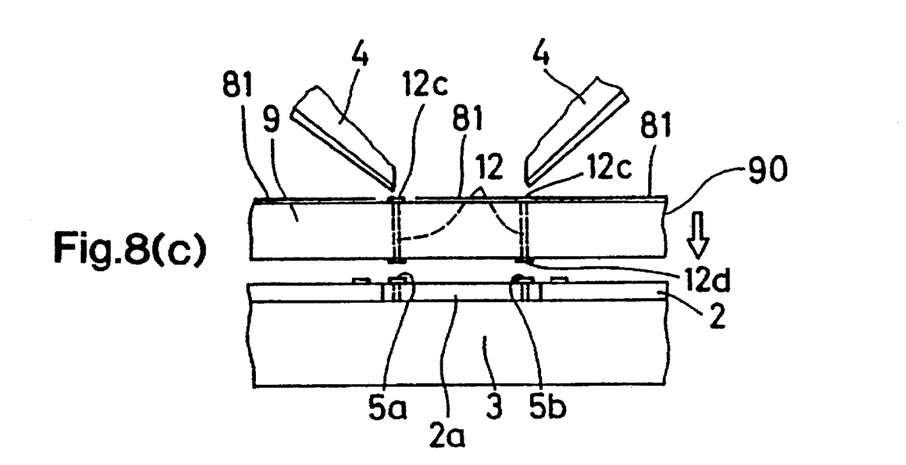

FIGS. 8(a)-8(c) show the vicinity of a spacer and an RF probe head comprising a TAB tape of a microwave band probing apparatus according to a seventh embodiment of the present invention. In the figures, reference numeral 12 designates via-holes produced at portions of the dielectric material layer 9 corresponding to the RF I/O electrode pads 5a and the grounding electrode pads 5b of the MMIC 2a, and wafer side electrodes have ends 12b and 12d on the opposite sides of the wafer 2 from electrode ends 12a and 12c. In addition, a ground layer 81 is located at the entire surface of the dielectric material layer 9 where the probing side electrodes 12a and 12c are located, except for the periphery of the probing side electrodes 12a. A lattice 83 on at the surface of the ground layer 81 is used for positional alignment of the electrodes 5a and 5b of the MMIC 2a and the wafer side electrode ends 12b and 12d. The above described elements 9, 12 to 12d, 81, 83 are part of a spacer member 9.

A description is given of the probing method.

The wafer side electrodes 12b and 12d of the dielectric material layer 9 confront to the wafer 2 mounted on the probe stage 3, and the positional alignment of the wafer side electrodes 12b and 12d and the electrode pads 5a and 5b of the MMIC 2a is carried out using the mark 83 as a reference, and respective pads and electrodes are put in contact with each other. Thereby, the ground voltage is supplied to the ground layer 81 via the via-hole 12 from the electrode pad 5b. By making the RF probe head 4 contact the probing side electrode 12a connected to the electrode pad 5a of the MMIC 2a to be tested, a test signal (microwave signal) is supplied, thereby enabling measurement of the electric characteristics of the MMIC 2a.

As described above, according to this seventh embodiment, the probing side electrodes 12a and 12c and the wafer side electrodes 12b and 12d connected by penetrating through the dielectric material layer 9 in the via-holes 12 are located at the portions of the dielectric layer material 9 corresponding to the electrodes 5a and 5b of the MMIC 2a on the wafer 2, and a ground layer 81 is present over the entire surface of one side of the dielectric material layer 9 except for the periphery of the probing side electrodes 12a, for probing employing the spacer member 90. Therefore, during the probing, the probe stage 3, the ground layer 81 and the via-holes 12 connected to the wafer side electrodes 12d serve as the ground plane, whereby the electrical characteristics of the MMIC 2a can be measured in a state close to a package mounted state. Furthermore, by carrying out probing by mounting the sheet-shaped dielectric material layer 9 on the wafer 2, adjacent MMICs 2a can be successively tested by performing a one time position determination, thereby improving the work efficiency.

Also in this embodiment, the dielectric material layer at above the MMIC 2a can be removed, using only the ground layer 81.

As is evident from the foregoing description, according to the first embodiment of the present invention, because the shielding metal or the ground plane of the TAB tape is electrically connected to the probe stage during the probing, and thereby the ground plane is produced above the MMIC similar to a packaged state, the conditions when measuring the microwave characteristics in an on-wafer state and in a packaged state are made approximately coincident with each other, whereby the electrical characteristics in a packaged state can be grasped in an on-wafer state.

According to the second embodiment of the present invention, by producing the upper surface of the shielding metal as a mesh, the positional alignment of the probe head with the MMIC at the probing is easily carried out.

According to the third embodiment of the present invention, by holding the shielding metal rotatably above the MMIC, the positional alignment of the probe head with the MMIC is carried out easily and the workability at the probing is improved.

According to the fourth embodiment of the present invention, because a DC bias is applied from the shielding metal to the MMIC, the electrical characteristics in an operation closer to the actual use state can be measured.

According to the fifth embodiment of the present invention, by providing an aperture at a part of the TAB tape, the positional alignment of the probe with the MMIC can be performed visually.

According to the sixth embodiment of the present invention, by providing the grounding contact electrode in contact with the ground electrode pad of the MMIC of the TAB tape and connected to the ground layer via a via-hole, the ground voltage can be supplied to the ground layer from the vicinity of the MMIC to be measured, and also a ground plane can be produced by the via-hole at upper side surfaces surrounding the MMIC, thereby enabling testing in a state close to a packaged state.

According to the seventh embodiment of the present invention, by performing probing employing a TAB tape having via-holes at positions corresponding to the electrode pads and the grounding electrode pads at the surface of the microwave integrated circuit and having a ground layer at one side surface thereof as a spacer, a plurality of MMICs can be tested successively from a one time position determination.

What is claimed is:

1. A microwave band probing apparatus comprising:

a wafer stage for mounting a wafer including a plurality of microwave integrated circuits;

an RF probe head for transmitting a microwave signal to a prescribed one of the microwave integrated circuits; and a shielding member hingedly connected to said RF probe head for selectively covering and electromagnetically shielding the prescribed microwave integrated circuit when said RF probe head is in contact with electrode pads of the prescribed microwave integrated circuit.

2. The microwave band probing apparatus of claim 1 wherein said shielding member is a mesh.

3. The microwave band probing apparatus of claim 1 wherein said shielding member includes DC voltage supplying means for supplying a DC bias to an electrode pad of the prescribed microwave integrated circuit.

4. The microwave band probing apparatus of claim 1 wherein said shielding member is electrically connected to said wafer stage.

5. A microwave band probing apparatus comprising:

a wafer stage for mounting a wafer including a plurality of microwave integrated circuits;

an RF probe head for transmitting a microwave signal to a prescribed one of the microwave integrated circuits; and a spacer material comprising:

a dielectric tape covering the prescribed microwave integrated circuit including:

first and second via-holes corresponding to an electrode pad and a ground electrode pad on the prescribed microwave integrated circuit, respectively;

a contact electrode at a terminating end of the first via-hole for contacting the electrode pad;

a grounding contact electrode at a terminating end of the second via-hole for contacting the ground electrode;

probing side electrodes at other terminating ends of the first and second via-holes; and a ground layer on one side of said dielectric tape except at said probing side electrode, microwave signals being transmitted to the prescribed microwave integrated circuit via said spacer material.

* * * * *

UNITED STATES PATENT AND TRADEMARK OFFICE
CERTIFICATE OF CORRECTION

PATENT NO. : 5,563,522
DATED : October 8, 1996
INVENTOR(S) : Abe

It is certified that error appears in the above-indentified patent and that said Letters Patent is hereby corrected as shown below: On the title page, Item 56: References Cited (U.S. Patent Documents); Insert

-- 4,513,266   4/1985   ISHIHARA ............ 333/238--;

Column 9, Line 13, change "RF probe head" to --wafer stage--;

Column 10, Line 23, change "electrode" to --electrodes--.

Signed and Sealed this

Twenty-fifth Day of February, 1997

Attest:

BRUCE LEHMAN

*Attesting Officer*   *Commissioner of Patents and Trademarks*